(12) United States Patent
Ogiso

(10) Patent No.: US 7,381,671 B2
(45) Date of Patent: Jun. 3, 2008

(54) FERROELECTRIC CERAMIC COMPOSITION AND APPLIED FERROELECTRIC ELEMENT INCLUDING SAME

(75) Inventor: Yoshifumi Ogiso, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 165 days.

(21) Appl. No.: 10/588,147

(22) PCT Filed: Nov. 17, 2004

(86) PCT No.: PCT/JP2004/017097

§ 371 (c)(1),
(2), (4) Date: Aug. 1, 2006

(87) PCT Pub. No.: WO2005/075378

PCT Pub. Date: Aug. 18, 2005

(65) Prior Publication Data

US 2007/0161497 A1      Jul. 12, 2007

(30) Foreign Application Priority Data

Feb. 6, 2004    (JP) .............................. 2004-031087

(51) Int. Cl.
*C04B 35/495*    (2006.01)
*H01L 41/187*    (2006.01)
(52) U.S. Cl. .................................. 501/135; 252/62.9 R
(58) Field of Classification Search ................ 501/134, 501/135; 252/62.9 R
See application file for complete search history.

(56) References Cited

U.S. PATENT DOCUMENTS 6,797,413 B2 *  9/2004  Takeishi et al. ............. 428/690
7,309,450 B2 * 12/2007  Nanao et al. .......... 252/62.9 R

FOREIGN PATENT DOCUMENTS

| JP | 2001-048646 A | 2/2001 |
| JP | 2001-1961884 | 7/2001 |
| JP | 2003-261379 A | 9/2003 |

OTHER PUBLICATIONS

Written Opinion of the International Searching Authority dated Jan. 18, 2005.
FERROELECTRICS, vol. 81 pp. 301-304 (1988).
Alkali Strontium-Barium-Lead Niobate . . . pp. 276-281, no date.
Ferroelectric Crystal . . . vol. 13 (1974), No. 8 pp. 1291-1292.

* cited by examiner

*Primary Examiner*—Karl E Group
(74) *Attorney, Agent, or Firm*—Dickstein, Shapiro, LLP.

(57) ABSTRACT

Disclosed is a ferroelectric ceramic composition that does not contain harmful lead and that have satisfactory sinterability, as well as a nonlinear optical element including the ferroelectric ceramic composition. The ferroelectric ceramic composition includes a main component represented by a general formula $(Ba_{1-x-y}Sr_xCa_y)Ag_{1-d}Nb_5O_{15-d/2}$ and having a tungsten bronze structure; and auxiliary components represented by a general formula $aMnO_2+bSiO_2$ (wherein a and b each represent parts by weight with respect to 100 parts by weight of the main component), wherein x, y, a, b, and d meet expressions $0.1 \leq x+y \leq 0.8$, $a+b \leq 5$, and $0 \leq d \leq 0.6$.

13 Claims, 4 Drawing Sheets

試料1

試料13

FERROELECTRIC CERAMIC COMPOSITION AND APPLIED FERROELECTRIC ELEMENT INCLUDING SAME

TECHNICAL FIELD

The present invention relates to ferroelectric ceramic compositions and applied ferroelectric elements. In particular, the present invention relates to a ferroelectric ceramic composition that is useful as a material for a piezoelectric or electrostrictive ceramic element, e.g., a ceramic filter, a ceramic resonator, or an actuator, and for a nonlinear optical element, e.g., an electrooptic effect element such as a Pockels cell, an optical harmonic-generating element, or a four-wave mixer (photorefractive element). The present invention also relates to an applied ferroelectric element including the ferroelectric ceramic composition.

BACKGROUND ART

Conventionally, ferroelectric ceramic compositions each composed of lead zirconate titanate ($Pb(Ti_xZr_{1-x})O_3$) or lead titanate ($PbTiO_3$) as a main component have been widely used as piezoelectric elements. Non-Patent Document 1 and the like disclose $(Ba,Sr)_2NaNb_5O_{15}$. Furthermore, Non-Patent Document 2 discloses $Ba_2AgNb_5O_{15}$.

Non-Patent Document 1: J. Am. Ceram. Soc., 52(1976)276

Non-Patent Document 2: J. J. Appl. Phys., 13(1974)1291

DISCLOSURE OF INVENTION

Problems to be Solved by Invention

However, such a piezoelectric ceramic composition mainly composed of lead zirconate titanate or lead titanate contains harmful lead. Thus, the production or disposal of the piezoelectric ceramic composition requires a costly countermeasure against lead.

Disadvantageously, $(Ba,Sr)_2NaNb_5O_{15}$ cannot be prepared by a simple process including mixing starting materials in water to form a slurry and then drying the resulting slurry because a Na compound of the starting material is soluble in water. Furthermore, there is concern that Na ions in the crystal segregate in grain boundaries and the interface between an electrode and the resulting ceramic article by diffusion or migration in a prolonged period of use to cause the collapse of the ceramic article due to moisture absorption.

Furthermore, $Ba_2AgNb_5O_{15}$ is difficult to sinter and thus has been not widely applied to practical use.

The present invention was accomplished in consideration of the above-described situation. It is an object of the present invention to provide a ferroelectric ceramic composition that does not contain harmful lead or a water-soluble alkali ion and that have satisfactory sinterability. It is another object of the present invention to provide a piezoelectric ceramic element, an electrostrictive ceramic element, and a nonlinear optical element, such as an electrooptic effect element or an optical harmonic-generating element, the elements including the ferroelectric ceramic composition.

Means for Solving the Problems

To overcome the above-described technical problems, a ferroelectric ceramic composition in accordance with the present invention includes a main component represented by a general formula $(Ba_{1-x-y}Sr_xCa_y)Ag_{1-d}Nb_5O_{15-d/2}$ and having a tungsten bronze structure, wherein x, y, and d meet the expressions: $0.1 \leq x+y \leq 0.8$; and $0 \leq d \leq 0.6$. Furthermore, the ferroelectric ceramic composition in accordance with the present invention further includes a Mn oxide and a Si oxide as auxiliary components in addition to the main component, wherein when the oxides are represented by a general formula $aMnO_2+bSiO_2$ (wherein a and b each represent parts by weight with respect to 100 parts by weight of the main component), a and b meet an expression $a+b \leq 5$. Moreover, the ferroelectric ceramic composition in accordance with the present invention can be applied to a piezoelectric ceramic element, an electrostrictive ceramic element, and a nonlinear optical element, such as an electrooptic effect element or an optical harmonic-generating element.

ADVANTAGES

The ferroelectric ceramic composition and the ceramic electronic component each having the above-described structure of the present invention each have satisfactory sinterability without harmful Pb and water-soluble alkali Ions.

Figure 1:
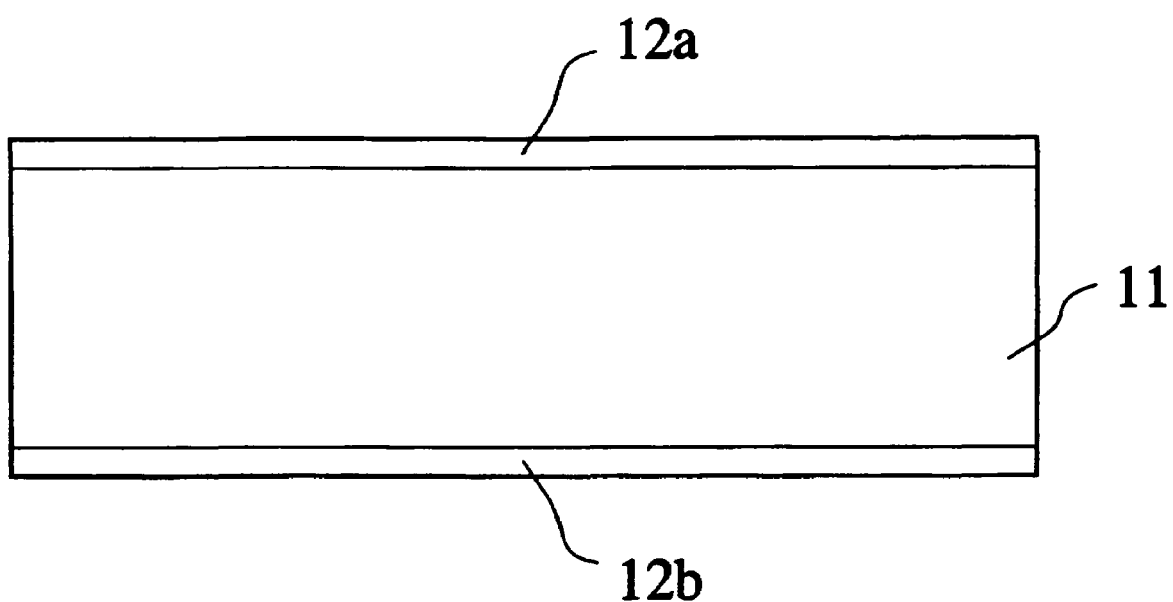
FIG. 1 shows a structure of an applied ferroelectric element.

REFERENCE NUMERALS 11 ferroelectric
12a, 12b electrode

BEST MODE FOR CARRYING OUT THE INVENTION

In the general formula of the ferroelectric ceramic composition in accordance with the present invention, when x+y<0.1, abnormal grain growth occurs in the sintered body. Thus, the stress generated in grain boundaries or grains increases abnormally. As a result, the shape of the sintered body is not maintained, which is not preferable. When x+y>0.8, the transition temperature, which is concerned with ferroelectricity, is reduced to 60° C. or lower, which is not preferable. Furthermore, when x+y>0.8, the Ag ions do not easily enter predetermined sites. Thus, Ag evaporates easily, resulting in d>0.6.

Therefore, in the present invention, the ranges of x and y is set at $0.1 \leq x+y \leq 0.8$. The range of d is set at $0 \leq d \leq 0.6$.

Furthermore, in the present invention, it is possible to reduce the firing temperature by incorporating the Mn oxide and the Si oxide into the main component. The total content of the Mn oxide and the Si oxide is preferably 5 parts by weight or less, in terms of $MnO_2$ and $SiO_2$, with respect to 100 parts by weight of the main component so that characteristics of the ferroelectric ceramic composition containing the Mn oxide and the Si oxide are not degraded compared with those of the composition not containing the oxides.

Furthermore, as long as the requirements are met, the ferroelectric ceramic composition in accordance with the present invention may be a homogeneous solid solution or a mixture of solid solutions. Moreover, the ferroelectric composition in accordance with the present invention may be a polycrystal or a single crystal.

Experimental examples for evaluating the characteristics of the ferroelectric ceramic composition in accordance with the present invention will be described below.

The ferroelectric ceramic composition in accordance with the present invention can be produced by the same process for producing a usual ferroelectric or a dielectric material. For example, predetermined amounts of $BaCO_3$, $SrCO_3$, $CaCO_3$, $Ag_2O$, and $Nb_2O_5$ are measured and mixed in deionized water for 4 to 24 hours with grinding media such as zirconia balls to form a slurry. To achieve a more uniform mixture, a dispersant such as a sorbitan ester may be added thereto. The resulting slurry is dried and calcined at 800° C. to 1,150° C. for 1 to 24 hours in an oxidative atmosphere with a usual electric furnace. The resulting calcine is mixed with deionized water and a binder such as a polyvinyl alcohol, pulverized with media, and dried. The resulting dry powder is processed with a uniaxial press to form disk specimens. The resulting specimens are fired at 950° C. to 1,350° C. for 3 to 10 hours in an oxidative atmosphere. This operation results in a ceramic article composed of the ferroelectric ceramic composition in accordance with the present invention. Furthermore, a single crystal can also be obtained from a similarly produced ceramic article by a zone melting method.

The ferroelectric ceramic compositions in accordance with the present invention can be used for piezoelectric or electrostrictive ceramic elements and nonlinear optical elements. These elements have various known shapes. As shown in FIG. 1, an example of an element having the simplest structure is an element including a flat ferroelectric plate 11 and electrodes 12a and 12b disposed on the respective surfaces of the flat ferroelectric plate 11.

The present invention will be described below on the basis of examples.

EXAMPLE 1

$BaCO_3$, $SrCO_3$, $CaCO_3$, $Ag_2O$, $Nb_2O_5$, $MnO_2$, and $SiO_2$ were prepared as starting materials. These starting materials were mixed so as to produce compositions each including a main component and auxiliary components, the main component being represented by a general formula $(Ba_{1-x-y}Sr_xCa_y)_2Ag_{1-d}Nb_5O_{15-d/2}$, the auxiliary components being represented by a general formula $aMnO_2+bSiO_2$ (wherein a and b each represent parts by weight with respect to 100 parts by weight of the main component), wherein x, y, a, and b are shown in Tables 1 and 2. The $Ag_2O$ contents were set such that d=0 in the general formula.

Each of the resulting mixtures was mixed in deionized water and then dried. Each resulting mixture was calcined at 1,100° C. to 1,150° C. for 10 hours in an oxidative atmosphere with an electric furnace. Each resulting calcine was pulverized into a powder. Then, 5 parts by weight of a polyvinyl alcohol was added to each powder with respect to 100 parts by weight of each resulting powder. Each resulting mixture was mixed and then dried into a powder. Each resulting powder was formed into a disk sample having a diameter of 12 mm and a thickness of 1 mm with a uniaxial press (pressure 1 GPa). These samples were fired at temperatures shown in Tables 1 and 2 in an oxidative atmosphere. Ag incorporated may partially evaporate in the firing step, thus resulting in d exceeding zero, in some cases. Furthermore, a single crystal was produced by a zone melting method from a fired bar produced from the calcined powder having the composition of Sample 5. The resulting crystal was cut into pieces each having a thickness of 1 mm. Then, a Ag paste was applied to top and bottom surfaces of each samples and baked at 800° C. Dielectric constants and transition temperatures of the resulting samples were measured. The remanent polarization of each sample that was subjected to a voltage of a 2 V/μm was also measured. Furthermore, the composition of each sample was analyzed to determine the value of d in the general formula. Tables 1, 2, and 3 also show the results.

In each sample shown in Table 1, the value of each of a and b in the general formula $aMnO_2+bSiO_2$ was zero, i.e., each sample shown in Table 1 does not contain the Mn oxide or the Si oxide as the auxiliary components.

In Table 1, each Example sample not marked with an asterisk "*" was produced within the range of the present invention. Each sample marked with an asterisk "*" was produced as a Comparative Example outside the range of the present invention.

In Table 2, each sample not marked with the asterisk "*" met requirements of both first and second aspects in accordance with the present invention. Each sample marked with the asterisk "*" met the requirement of the first aspect but did not meet the requirement of the second aspect in accordance with the present invention.

Furthermore, Table 3 shows the example of the single crystal described above.

TABLE 1

| Sample | x | y | Calcination temperature/ ° C. | Firing temperature/ ° C. | Relative dielectric constant | Transition temperature/ ° C. | Remanent polarization/ $\mu C \cdot cm^{-2}$ | d |
|---|---|---|---|---|---|---|---|---|
| *1 | 0.0 | 0.0 | 1150 | 1350 | 430 | 420 | 0.97 | 0.19 |
| 2 | 0.1 | 0.0 | 1150 | 1300 | 642 | 360 | 1.05 | 0.09 |
| 3 | 0.0 | 0.1 | 1150 | 1250 | 387 | 350 | 1.01 | 0.15 |
| 4 | 0.2 | 0.0 | 1150 | 1300 | 531 | 320 | 1.10 | 0.00 |
| 5 | 0.1 | 0.1 | 1150 | 1250 | 544 | 312 | 0.94 | 0.00 |
| 6 | 0.0 | 0.2 | 1150 | 1250 | 521 | 322 | 1.07 | 0.01 |
| 7 | 0.3 | 0.0 | 1150 | 1300 | 639 | 237 | 1.16 | 0.04 |
| 8 | 0.2 | 0.1 | 1150 | 1200 | 652 | 242 | 0.98 | 0.03 |
| 9 | 0.1 | 0.2 | 1150 | 1150 | 494 | 266 | 0.88 | 0.14 |
| 10 | 0.0 | 0.3 | 1150 | 1200 | 457 | 281 | 1.14 | 0.15 |
| 11 | 0.4 | 0.0 | 1150 | 1300 | 629 | 187 | 1.22 | 0.00 |
| 12 | 0.3 | 0.1 | 1150 | 1250 | 653 | 193 | 1.15 | 0.02 |
| 13 | 0.1 | 0.3 | 1150 | 1200 | 652 | 225 | 0.93 | 0.06 |

TABLE 1-continued

| Sample | x | y | Calcination temperature/ ° C. | Firing temperature/ ° C. | Relative dielectric constant | Transition temperature/ ° C. | Remanent polarization/ $\mu C \cdot cm^{-2}$ | d |
|---|---|---|---|---|---|---|---|---|
| 14 | 0.0 | 0.4 | 1150 | 1200 | 647 | 237 | 1.18 | 0.28 |
| 15 | 0.5 | 0.0 | 1150 | 1300 | 602 | 155 | 1.29 | 0.07 |
| 16 | 0.4 | 0.1 | 1150 | 1250 | 626 | 157 | 1.18 | 0.10 |
| 17 | 0.3 | 0.2 | 1150 | 1200 | 625 | 171 | 0.95 | 0.03 |
| 18 | 0.1 | 0.4 | 1150 | 1150 | 671 | 203 | 1.08 | 0.12 |
| 19 | 0.0 | 0.5 | 1150 | 1150 | 659 | 196 | 1.24 | 0.22 |
| 20 | 0.6 | 0.0 | 1150 | 1250 | 933 | 125 | 1.28 | 0.14 |
| 21 | 0.5 | 0.1 | 1150 | 1200 | 875 | 131 | 1.08 | 0.10 |
| 22 | 0.3 | 0.3 | 1150 | 1200 | 765 | 142 | 0.96 | 0.43 |
| 23 | 0.1 | 0.5 | 1150 | 1150 | 632 | 146 | 1.16 | 0.42 |
| 24 | 0.0 | 0.6 | 1150 | 1200 | 565 | 146 | 1.29 | 0.48 |
| 25 | 0.7 | 0.0 | 1150 | 1250 | 1284 | 90 | 1.16 | 0.06 |
| 26 | 0.6 | 0.1 | 1150 | 1200 | 1221 | 91 | 0.94 | 0.24 |
| 27 | 0.4 | 0.3 | 1150 | 1200 | 1018 | 92 | 0.86 | 0.30 |
| 28 | 0.3 | 0.4 | 1150 | 1200 | 892 | 93 | 0.98 | 0.33 |
| 29 | 0.1 | 0.6 | 1150 | 1150 | 422 | 98 | 1.22 | 0.43 |
| 30 | 0.0 | 0.7 | 1150 | 1200 | 343 | 105 | 1.30 | 0.53 |
| 31 | 0.8 | 0.0 | 1150 | 1300 | 1195 | 65 | 1.07 | 0.14 |
| 32 | 0.7 | 0.1 | 1150 | 1300 | 1190 | 63 | 0.73 | 0.18 |
| 33 | 0.5 | 0.3 | 1150 | 1300 | 1182 | 62 | 0.72 | 0.28 |
| 34 | 0.3 | 0.5 | 1150 | 1150 | 372 | 67 | 0.94 | 0.44 |
| 35 | 0.1 | 0.7 | 1150 | 1150 | 183 | 74 | 1.09 | 0.57 |
| 36 | 0.0 | 0.8 | 1150 | 1150 | 190 | 95 | 1.10 | 0.59 |
| *37 | 0.9 | 0.0 | 1150 | 1250 | 867 | 48 | 1.02 | 0.71 |
| *38 | 0.7 | 0.2 | 1150 | 1300 | 245 | 23 | 0.37 | 0.80 |
| *39 | 0.5 | 0.4 | 1150 | 1100 | 47 | 2 | 0.47 | 0.80 |
| *40 | 0.3 | 0.6 | 1150 | 1100 | 63 | 22 | 0.71 | 0.92 |
| *41 | 0.1 | 0.8 | 1150 | 1100 | 92 | 55 | 0.78 | 0.88 |
| *42 | 0.0 | 0.9 | 1150 | 1100 | 115 | 55 | 0.80 | 0.77 |

TABLE 2

| Sample | x | y | a | b | Calcinations temperature/ ° C. | Firing temperature/ ° C. | Relative dielectric constant | Transition temperature/ ° C. | Remanent polarization/ $\mu C \cdot cm^{-2}$ | d |
|---|---|---|---|---|---|---|---|---|---|---|
| 43 | 0.1 | 0.0 | 5.0 | 0.0 | 1100 | 1200 | 640 | 361 | 0.98 | 0.04 |
| 44 | 0.0 | 0.1 | 0.0 | 5.0 | 1100 | 1150 | 380 | 353 | 0.92 | 0.04 |
| 45 | 0.2 | 0.0 | 0.5 | 0.0 | 1100 | 1200 | 582 | 326 | 1.01 | 0.04 |
| 46 | 0.1 | 0.1 | 0.5 | 1.0 | 1100 | 1150 | 566 | 314 | 0.92 | 0.03 |
| 47 | 0.1 | 0.1 | 2.5 | 2.5 | 1100 | 1150 | 552 | 308 | 0.90 | 0.02 |
| *48 | 0.1 | 0.0 | 6.0 | 0.0 | 1100 | 1200 | 582 | 321 | 0.56 | 0.09 |
| *49 | 0.0 | 0.1 | 0.0 | 6.0 | 1100 | 1150 | 277 | 345 | 0.64 | 0.14 |
| *50 | 0.2 | 0.0 | 6.0 | 0.0 | 1100 | 1200 | 422 | 318 | 0.57 | 0.00 |
| *51 | 0.1 | 0.1 | 3.0 | 3.0 | 1100 | 1150 | 285 | 304 | 0.45 | 0.02 |
| *52 | 0.0 | 0.2 | 2.5 | 3.0 | 1100 | 1200 | 396 | 313 | 0.49 | 0.02 |

TABLE 3

| Sample | x | y | Relative dielectric constant (001) direction | Relative dielectric constant (100) direction | Remanent polarization/ $\mu C \cdot cm^{-2}$ (001) direction | Remanent polarization/ $\mu C \cdot cm^{-2}$ (100) direction | Transition temperature/ ° C. | d |
|---|---|---|---|---|---|---|---|---|
| 53 | 0.1 | 0.1 | 673.0 | 328.0 | 2.2 | 0.3 | 303 | 0.21 |

Figure 2:
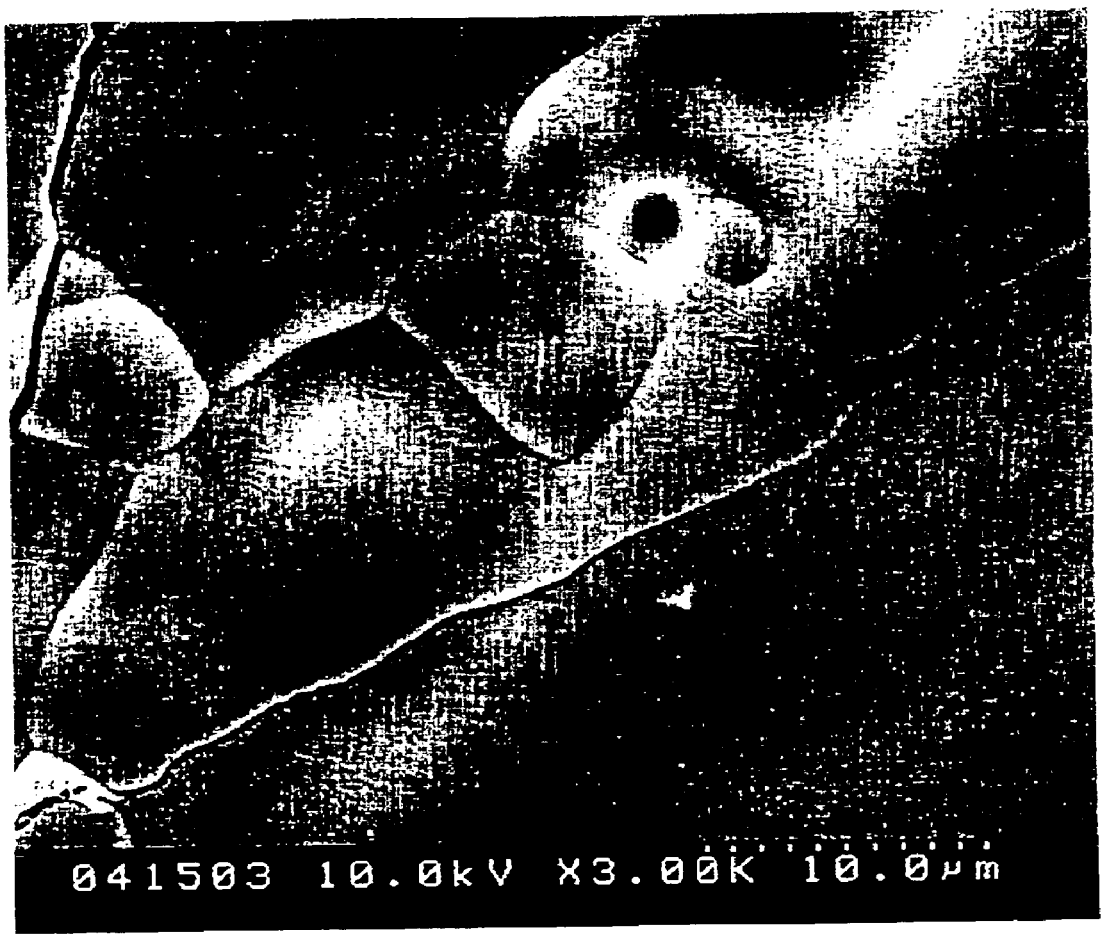
FIG. 2 is an electron micrograph of a surface of Sample 1.
Figure 3:
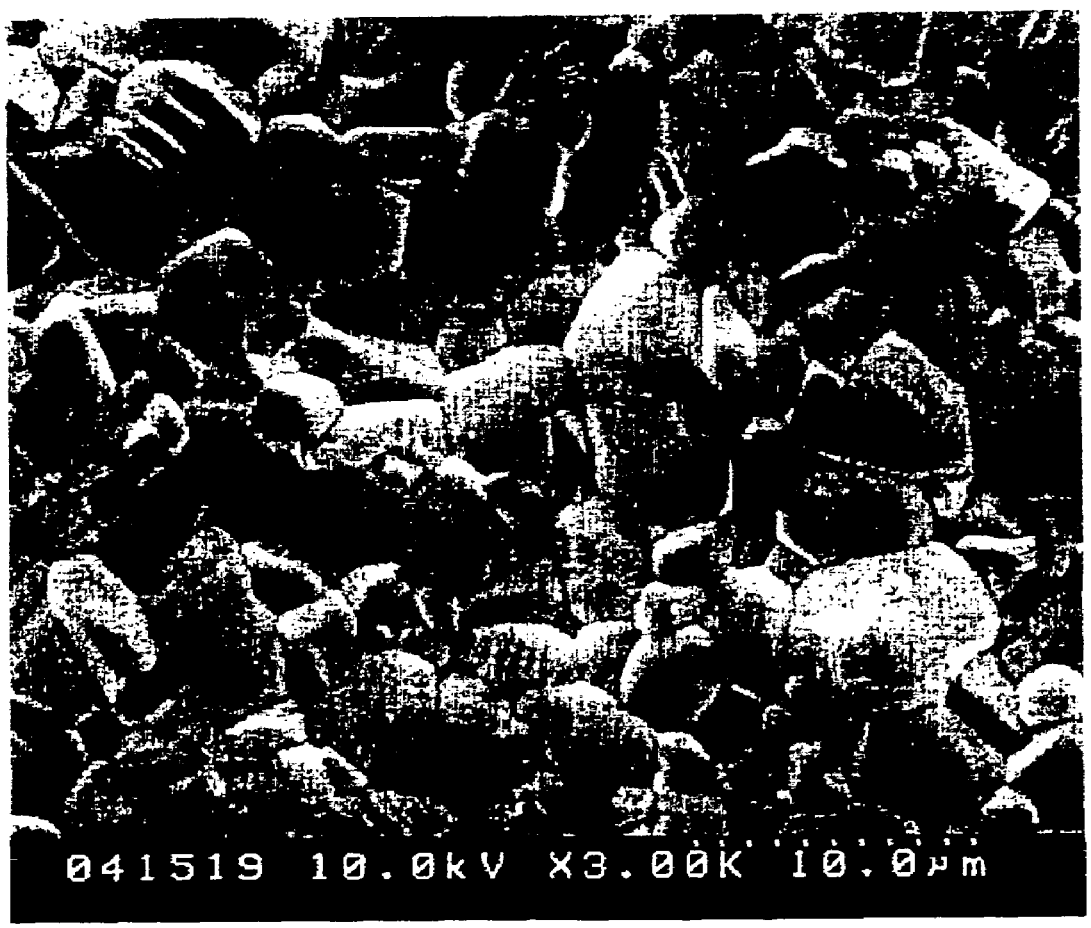
FIG. 3 is an electron micrograph of a surface of Sample 13.

As is clear from Table 1, the transition temperature in each of Samples 37 to 42, in which x+y exceeds 0.8, and d exceeds 0.6, decreased near room temperature. Although Sample 1, in which x+y was below 0.1, could be barely measured, the sample was fragile; hence, the sample cannot be used for practical use. FIGS. 2 and 3 show electron micrographs of surfaces of Samples 1 and 13, respectively, in the experimental examples in accordance with the present invention. In Sample 13, a dense sintered body was observed. In contrast, in Sample 1, it was observed that the grains were largely grown, and cracks were created.

As is clear from Table 2, in each of Samples 48 to 52, in which the total content of the Mn oxide and the Si oxide (the sum of a and b in the general formula) exceeds 5, i.e., in each sample fulfilling the requirement of the first aspect in accordance with the present invention but not fulfilling the second aspect in accordance with the present invention, the dielectric constant was 277 to 582, and the transition temperature was 304° C. to 345° C. These values were comparable to those in Samples 43 to 47. However, the remanent polarization after the sample was subjected to a voltage of 2 V/μm at room temperature was as low as 0.45 to 0.64 μC·cm$^{-2}$. In contrast, in each of Samples 43 to 47, in which the total content of the Mn oxide and/or the Si oxide is 5 parts by weight or less, in terms of MnO$_2$ and SiO$_2$, with respect to 100 parts by weight of the main component, i.e., in each sample fulfilling the requirement of the first aspect and the second aspect in accordance with the present invention, it is found that the firing temperature can be reduced without a large change in transition temperature, and the dielectric constant is stabilized and slightly increased by virtue of improved sinterability, as compared with the case the Mn oxide and/or Si oxide are not incorporated (for example, Sample 2 to 5 in Table 1). Furthermore, in each of Samples 43 to 47, the remanent polarization after the sample was subjected to a voltage of 2 V/μm at room temperature was as high as 0.90 to 1.01. This shows that the characteristics as a ferroelectric material are sufficiently ensured.

The d values of Samples 43 to 47 in Table 2 are different from the d values of Samples 2 to 5 in Table 1. This is due to the influence of the incorporation of the Mn oxide and the Si oxide, which are auxiliary components. It is believed that such differences in d values between Samples 43 to 47 in Table 2 and Samples 2 to 5 in Table 1 have negligible effects on the physical properties.

In the above-described example, BaCO$_3$, SrCO$_3$, CaCO$_3$, Ag$_2$O, Nb$_2$O$_5$, MnO$_2$ and SiO$_2$ were used as the materials of Ba, Sr, Ca, Ag, Nb, Mn, and Si, respectively. Alternatively, other compounds, for example, oxides, hydroxides, carbonates, and these materials were performed in deionized water. However, a general solvent, such as ethyl alcohol, may be used. The zone melting method was employed as a method for producing the single crystal. Alternatively, the ordinary Czochralski method, a LPE method, or the like can be employed.

Figure 4:
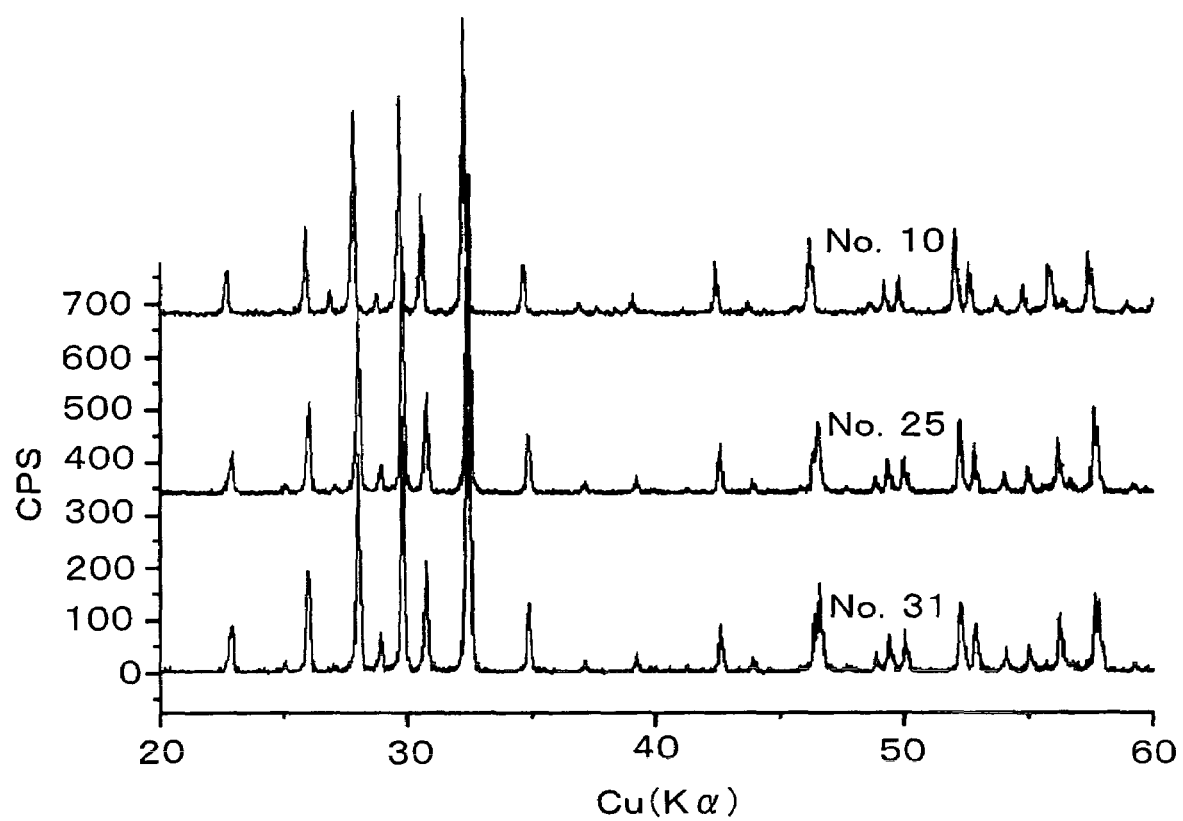
FIG. 4 shows X-ray diffraction patterns of Sample 10, 25, and 31.

FIG. 4 shows X-ray diffraction patterns of Sample 10, 25, and 31. Any one of the patterns shows a tungsten bronze structure.

INDUSTRIAL APPLICABILITY

In accordance with the present invention, a ferroelectric ceramic composition that does not contain harmful lead or a water-soluble alkali ion and that have satisfactory sinterability can be obtained. Furthermore, a piezoelectric ceramic element, an electrostrictive ceramic element, and a nonlinear optical element, such as an electrooptic effect element or an optical harmonic-generating element can be obtained by using the ferroelectric ceramic composition.

Accordingly, the present invention can be widely applied in various fields, such as piezoelectric ceramic elements, electrostrictive ceramic elements, and nonlinear optical elements, e.g. electrooptic effect elements and optical harmonic-generating elements.

As is clear from Table 1, the transition temperature in each of Samples 37 to 42, in which x+y exceeds 0.8, and d exceeds 0.6, decreased near room temperature. Although Sample 1, in which x+y was below 0.1, could be barely measured, the sample was fragile; hence, the sample cannot be used for practical use. FIGS. 2 and 3 show electron micrographs of surfaces of Samples 1 and 13, respectively, in the experimental examples in accordance with the present invention. In Sample 13, a dense sintered body was observed. In contrast, in Sample 1, it was observed that the grains were largely grown, and cracks were created.

As is clear from Table 2, in each of Samples 48 to 52, in which the total content of the Mn oxide and the Si oxide (the sum of a and b in the general formula) exceeds 5, i.e., in each sample fulfilling the requirement of the first aspect in accordance with the present invention but not fulfilling the second aspect in accordance with the present invention, the dielectric constant was 277 to 582, and the transition temperature was 304° C. to 345° C. These values were comparable to those in Samples 43 to 47. However, the remanent polarization after the sample was subjected to a voltage of 2 V/μm at room temperature was as low as 0.45 to 0.64 μC·cm$^{-2}$. In contrast, in each of Samples 43 to 47, in which the total content of the Mn oxide and/or the Si oxide is 5 parts by weight or less, in terms of MnO$_2$ and SiO$_2$, with respect to 100 parts by weight of the main component, i.e., in each sample fulfilling the requirement of the first aspect and the second aspect in accordance with the present invention, it is found that the firing temperature can be reduced without a large change in transition temperature, and the dielectric constant is stabilized and slightly increased by virtue of improved sinterability, as compared with the case the Mn oxide and/or Si oxide are not incorporated (for example, Sample 2 to 5 in Table 1). Furthermore, in each of Samples 43 to 47, the remanent polarization after the sample was subjected to a voltage of 2 V/μm at room temperature was as high as 0.90 to 1.01. This shows that the characteristics as a ferroelectric material are sufficiently ensured.

The d values of Samples 43 to 47 in Table 2 are different from the d values of Samples 2 to 5 in Table 1. This is due to the influence of the incorporation of the Mn oxide and the Si oxide, which are auxiliary components. It is believed that such differences in d values between Samples 43 to 47 in Table 2 and Samples 2 to 5 in Table 1 have negligible effects on the physical properties.

In the above-described example, BaCO$_3$, SrCO$_3$, CaCO$_3$, Ag$_2$O, Nb$_2$O$_5$, MnO$_2$ and SiO$_2$ were used as the materials of Ba, Sr, Ca, Ag, Nb, Mn, and Si, respectively. Alternatively, other compounds, for example, oxides, hydroxides, carbonates, and organic salts of those metals may be used as the materials. Mixing and the like of these materials were performed in deionized water. However, a general solvent, such as ethyl alcohol, may be used. The zone melting method was employed as a method for producing the single crystal. Alternatively, the ordinary Czochralski method, a LPE method, or the like can be employed.

FIG. 4 shows X-ray diffraction patterns of Sample 10, 25, and 31. Any one of the patterns shows a tungsten bronze structure.

INDUSTRIAL APPLICABILITY

In accordance with the present invention, a ferroelectric ceramic composition that does not contain harmful lead or a water-soluble alkali ion and that have satisfactory sinterability can be obtained. Furthermore, a piezoelectric ceramic element, an electrostrictive ceramic element, and a nonlinear optical element, such as an electrooptic effect element or an optical harmonic-generating element can be obtained by using the ferroelectric ceramic composition.

Accordingly, the present invention can be widely applied in various fields, such as piezoelectric ceramic elements, electrostrictive ceramic elements, and nonlinear optical elements, e.g. electrooptic effect elements and optical harmonic-generating elements.

The invention claimed is:

1. A ferroelectric ceramic composition, comprising:
a main component represented by a general formula $(Ba_{1-x-y}Sr_xCa_y)Ag_{1-d}Nb_5O_{15-d/2}$ and having a tungsten bronze structure, wherein:

$0.1 \leq x+y \leq 0.8$; and $0 \leq d \leq 0.6$.

2. The ferroelectric ceramic composition according to claim 1, further comprising:
at least one of a Mn oxide and a Si oxide as auxiliary components, wherein when the oxides are represented by a general formula $aMnO_2+bSiO_2$ (wherein a and b each represent parts by weight with respect to 100 parts by weight of the main component), and $a+b \leq 5$.

3. The ferroelectric ceramic composition according to claim 1, wherein x is 0.

4. The ferroelectric ceramic composition according to claim 1, wherein y is 0.

5. The ferroelectric ceramic composition according to claim 1, wherein $0 \leq d \leq 0.5$.

6. The ferroelectric ceramic composition according to claim 2, wherein a is 0.

7. The ferroelectric ceramic composition according to claim 2, wherein b is 0.

8. The ferroelectric ceramic composition according to claim 2, disposed in a piezoelectric ceramic element.

9. The ferroelectric ceramic composition according to claim 2, disposed in an electrostrictive ceramic element.

10. The ferroelectric ceramic composition according to claim 2, disposed in a nonlinear optical element.

11. The ferroelectric ceramic composition according to claim 1, disposed in a piezoelectric ceramic element.

12. The ferroelectric ceramic composition according to claim 1, disposed in an electrostrictive ceramic element.

13. The ferroelectric ceramic composition according to claim 1, disposed in a nonlinear optical element.

* * * * *